(12) United States Patent
Gillotti

(10) Patent No.: US 8,152,046 B2
(45) Date of Patent: Apr. 10, 2012

(54) CONDUCTIVE BUMPS, WIRE LOOPS, AND METHODS OF FORMING THE SAME

(75) Inventor: Gary S. Gillotti, Lansdale, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 0 days.

(21) Appl. No.: 13/063,852

(22) PCT Filed: Mar. 26, 2010

(86) PCT No.: PCT/US2010/028824
§ 371 (c)(1),
(2), (4) Date: Mar. 14, 2011

(87) PCT Pub. No.: WO2010/120473
PCT Pub. Date: Oct. 21, 2010

(65) Prior Publication Data
US 2012/0006882 A1    Jan. 12, 2012

Related U.S. Application Data

(60) Provisional application No. 61/165,679, filed on Apr. 1, 2009.

(51) Int. Cl.
*B23K 31/02* (2006.01)
(52) U.S. Cl. .................. 228/180.5; 228/4.5; 228/904
(58) Field of Classification Search .............. 228/180.5, 228/4.5, 904
See application file for complete search history.

(56) References Cited

U.S. PATENT DOCUMENTS

| | | | |
|---|---|---|---|
| 5,981,371 A | 11/1999 | Yamazaki et al. | |
| 7,188,759 B2 | 3/2007 | Calpito et al. | |
| 7,229,906 B2 | 6/2007 | Babinetz et al. | |
| 2004/0164128 A1* | 8/2004 | Mii | 228/180.5 |
| 2007/0199974 A1 | 8/2007 | Babinetz et al. | |

FOREIGN PATENT DOCUMENTS

| | | |
|---|---|---|
| JP | 05-047770 | 2/1993 |
| KR | 10-1998-0053197 | 9/1998 |

OTHER PUBLICATIONS

International Search Report and Written Opinion dated Oct. 4, 2010, International Application No. PCT/US2010/028824.

\* cited by examiner

*Primary Examiner* — Jessica L Ward
*Assistant Examiner* — Erin Saad
(74) *Attorney, Agent, or Firm* — Christopher M. Spletzer, Sr.

(57) ABSTRACT

A method of forming a conductive bump is provided. The method includes the steps of: (1) bonding a free air ball to a bonding location using a bonding tool to form a bonded ball; (2) raising the bonding tool to a desired height, with a wire clamp open, while paying out wire continuous with the bonded ball; (3) closing the wire clamp; (4) lowering the bonding tool to a smoothing height with the wire clamp still closed; (5) smoothing an upper surface of the bonded ball, with the wire clamp still closed, using the bonding tool; and (6) raising the bonding tool, with the wire clamp still closed, to separate the bonded ball from wire engaged with the bonding tool.

51 Claims, 4 Drawing Sheets

CONDUCTIVE BUMPS, WIRE LOOPS, AND METHODS OF FORMING THE SAME

CROSS-REFERENCE TO RELATED APPLICATION

This application claims the benefit of the International Application No. PCT/US2010/028824 filed on Mar. 26, 2010 which claims the benefit of U.S. Provisional Application No. 61/165,679, filed Apr. 1, 2009, the contents of both of which are incorporated herein by reference.

FIELD OF THE INVENTION

The present invention relates to conductive bumps and wire loops utilizing conductive bumps, and to improved methods of forming conductive bumps and wire loops.

BACKGROUND OF THE INVENTION

In the processing and packaging of semiconductor devices, conductive bumps are formed for use in providing electrical interconnections. For example, such bumps may be provided for: (1) use in flip-chip applications, (2) use as stand-off conductors, (3) wire looping applications, (4) test points for testing applications, amongst others. Such conductive bumps may be formed in varying techniques. One such technique is to form the conductive bumps using wire, such as on a wire bonding machine or a stud bumping machine.

Numerous techniques for forming conductive bumps on a wire bonding machine or bumping machine are disclosed in U.S. Pat. No. 7,229,906 (entitled "METHOD AND APPARATUS FOR FORMING BUMPS FOR SEMICONDUCTOR INTERCONNECTIONS USING A WIRE BONDING MACHINE") and U.S. Pat. No. 7,188,759 (entitled "METHOD FOR FORMING CONDUCTIVE BUMPS AND WIRE LOOPS"), both of which are incorporated by reference in their entirety.

FIG. 1 illustrates an exemplary sequence of forming a conductive bump on a wire bonding machine or bumping machine. At Step 1, free air ball 100$a$ is seated at the tip of bonding tool 102. As will be understood by those skilled in the art, prior to Step 1, free air ball 100$a$ has been formed on an end of wire 100 that hangs below the tip of bonding tool 102 using an electronic flame-off device or the like. Wire clamp 104 is also shown at Step 1 in the open position. As will be understood by those skilled in the art, wire 100 is provided by a wire spool on the machine (not shown). Wire 100 extends from the wire spool through wire clamp 104 (and through other structures not shown) and through bonding tool 102.

After free air ball 100$a$ is formed (prior to Step 1), wire 100 is drawn upwards (e.g., using a vacuum control tensioner or the like) such that free air ball 100$a$ is seated at the tip of bonding tool 102 as shown at Step 1 of FIG. 1. At Step 2, bonding tool 102 (along with other elements of a bond head assembly including wire clamp 104) is lowered and free air ball 100$a$ is bonded to bonding location 106 (e.g., a die pad of semiconductor die 106). As will be understood by those skilled in the art, the bonding of free air ball 100$a$ to bonding location 106 may utilize ultrasonic energy, thermosonic energy, thermocompressive energy, XY table scrub, combinations thereof, amongst other techniques.

After free air ball 100$a$ is bonded to bonding location 106 at Step 2 (where the bonded free air ball may now be termed bonded ball 100$b$), with wire clamp 104 still open, bonding tool 102 is raised to a desired height. This height may be referred to as a separation height (from viewing Step 3 of FIG. 1, one can see that bonding tool 102 has been raised such that bonded ball 100$b$ is no longer seated in the tip of bonding tool 102). At Step 4, with wire clamp 104 still open, bonding tool 102 is moved in at least one horizontal direction (e.g., along the X axis or Y axis of the machine) to smooth the top surface of bonded ball 100$b$. Such smoothing provides a desirable top surface for a conductive bump, and also weakens the connection between bonded ball 100$b$ and the rest of the wire to assist in the separation therebetween. At Step 5, bonding tool 102 is raised to another height (which may be referred to as the wire tail height), and then wire clamp 104 is closed. Then at Step 6, bonding tool 102 is raised to break the connection between bonded ball 100$b$ (which may now be termed conductive bump 100$c$) and the remainder of wire 100. For example, bonding tool 102 may be raised to an EFO height which is a position at which an electronic flame-off device forms a free air ball on wire tail 100$d$ of wire 100.

Forming conductive bumps using such conventional techniques involves certain deficiencies. For example, during the smoothing motions in Step 4, the connection between bonded ball 100$b$ and the rest of the wire is weakened; however, in certain processes the connection may be weakened to the point where the connection breaks prematurely (that is, the connection may separate during the rise to tail height shown at Step 5 prior to the closing of clamp 104). If such a premature separation occurs, the wire tail that is provided for the next free air ball (that is, wire tail 100$d$) may be short (i.e., a short tail condition). In an attempt to avoid such a problem the smoothing in Step 4 may be reduced such that the connection is not excessively weakened; however, this reduction in smoothing may have deleterious effects in terms of the resultant bump surface. Yet another problem that may result is a long tail, where too much wire is on the wire tail. These problems tend to result in yield loss and inconsistency among the conductive bumps.

Further, forming second bonds on a conventional bump (e.g., such as in an SSB type process) involves certain challenges related to, for example, the compliant nature of the bump and the physical configuration of the top surface of the bump. These challenges tend to result in poorly formed second/stitch bonds and potential short tail conditions.

Thus, it would be desirable to provide improved conductive bumps, and improved methods of forming the conductive bumps.

SUMMARY OF THE INVENTION

According to an exemplary embodiment of the present invention, a method of forming a conductive bump is provided. The method includes the steps of: (1) bonding a free air ball to a bonding location using a bonding tool to form a bonded ball; (2) raising the bonding tool to a desired height, with a wire clamp open, while paying out wire continuous with the bonded ball; (3) closing the wire clamp; (4) lowering the bonding tool to a smoothing height with the wire clamp still closed; (5) smoothing an upper surface of the bonded ball, with the wire clamp still closed, using the bonding tool; and (6) raising the bonding tool, with the wire clamp still closed, to separate the bonded ball from wire engaged with the bonding tool.

According to another exemplary embodiment of the present invention, a method of forming a wire loop is provided. The method includes the steps of: (1) forming a conductive bump on a bonding location, the step of forming the conductive bump being according to the present invention; (2) bonding a portion of wire to another bonding location using the bonding tool; (3) extending a length of wire from the bonded portion of wire to the conductive bump; and (4) bonding an end of the length of wire to the conductive bump.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

In certain exemplary embodiments of the present invention, conductive bumps are formed. An upper surface of a conductive bump is smoothed, for example, using an XY smoothing motion of a bonding tool. After deposition and bonding of a free air ball to form the conductive bump, but prior to the smoothing of the upper surface, the bonding tool is raised to a desired height (e.g., a tail height) with the wire clamp open. Then the wire clamp is closed and the bonding tool is lowered to perform the upper surface smoothing of the conductive bump. This process results in a slack length of wire between the top of the bonding tool and the bottom of the wire clamp. After completion of the smoothing of the upper surface of the bump, the bonding tool is raised to separate the conductive bump from the remainder of the wire. In this process, the slack length of wire now facilitates a desirable wire tail length, thereby substantially reducing the potential for shorts tails and associated problems.

Thus according to the present invention, during a "smoothing" process (see Step 6 of FIG. 2), the wire clamp remains closed which substantially reduces the potential for (or even prevents) the wire from passing through the bonding tool creating a stoppage in the process (which may result in a short tail error). In contrast to conventional techniques (where the wire tail is formed after the smoothing is complete), the wire tail is formed before the smoothing occurs. Yet another advantage is that the wire tail will tend to be stronger as compared to conventional processes because no smoothing motion has occurred to weaken the wire tail, thereby reducing the potential for additional errors.

Figure 2:
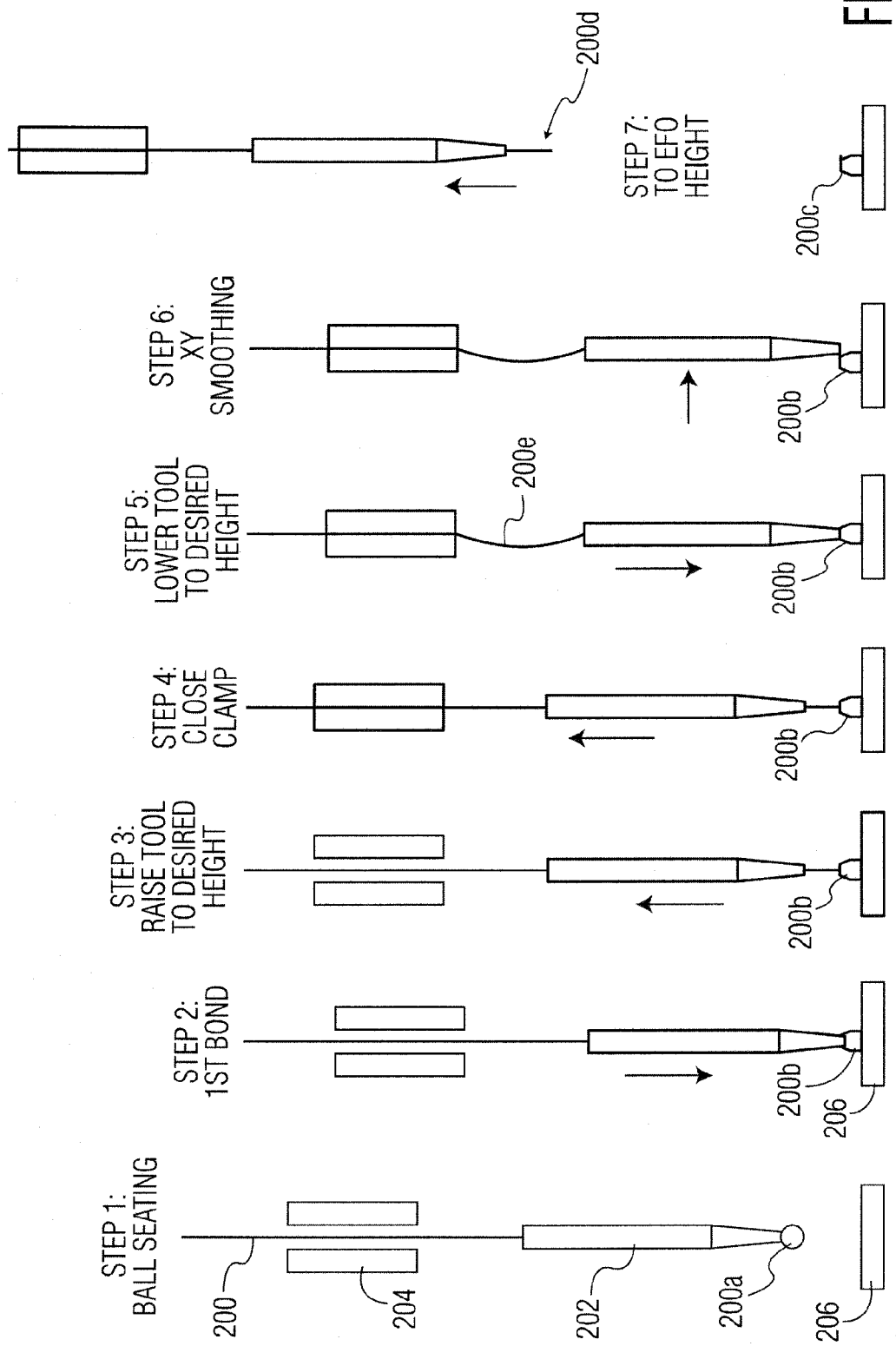
FIG. 2 is a series of diagrams illustrating a method of forming a conductive bump in accordance with an exemplary embodiment of the present invention.

FIG. 2 illustrates an exemplary sequence of forming a conductive bump on a wire bonding machine or bumping machine according to the present invention. At Step 1, free air ball 200a is seated at the tip of bonding tool 202. As will be understood by those skilled in the art, prior to Step 1, free air ball 200a has been formed on an end of wire 200 that hangs below the tip of bonding tool using an electronic flame-off device or the like. Wire clamp 204 is also shown at Step 1 in the open position.

After free air ball 200a is formed (prior to Step 1), wire 200 is drawn upwards (e.g., using a vacuum control tensioner or the like) such that free air ball 200a is seated at the tip of bonding tool 202 as shown at Step 1 of FIG. 2. At Step 2, bonding tool 202 (along with other elements of a bond head assembly including wire clamp 204) is lowered and free air ball 200a is bonded to bonding location 206 (e.g., a die pad of semiconductor die 206). As will be understood by those skilled in the art, the bonding of free air ball 200a to bonding location 206 may utilize ultrasonic energy, thermosonic energy, thermocompressive energy, XY table scrub, combinations thereof, amongst other techniques.

After bonding of free air ball 200a at Step 2 (but before Step 3) other motions may be completed as desired. For example, a fold of wire may be formed on bonded ball 200b before Step 3 such as is described in U.S. Pat. No. 7,229,906. Of course, other motions and configurations of bonded ball 200b are contemplated.

After free air ball 200a is bonded to bonding location 206 at Step 2 (where the bonded free air ball may now be termed bonded ball 200b), with wire clamp 204 still open, bonding tool 202 is raised to a desired height at Step 3. This height may be referred to as a tail height (from viewing Step 3 of FIG. 2 one can see that the tip of bonding tool is separated from bonded ball 200b at this height); however, it is understood that different heights may be selected. While the invention is not limited thereto, exemplary ranges for this height are between 5-20 mils and between 10-20 mils above the top of bonded free air ball 200b. At Step 4, wire clamp 204 is closed. At Step 5, bonding tool 202 is lowered to a desired height. This height may be referred to as a separation height (from viewing Step 5 of FIG. 2, one can see that the tool has been lowered such that the tip of bonding tool 202 is just barely in contact with an upper surface of bonded ball 200b. While the invention is not limited thereto, exemplary ranges for this height are between 0.1-2 mils and between 1-2 mils above the height of bonding tool 202 at Step 2. At Step 5, by lowering bonding tool 202 with the wire clamp closed, a slack length of wire 200e has been provided below the bottom of wire clamp 204 and above bonding tool 202. At Step 6, with wire clamp 104 still closed, bonding tool 202 is moved in at least one horizontal direction (e.g., along the X axis, the Y axis, both the X and Y axes, another horizontal direction, etc.) to smooth the top surface of bonded free air ball 200a. Such smoothing provides a desirable top surface for a conductive bump, and also weakens the connection between the bonded ball and the rest of the wire to assist in the separation therebetween. At Step 7, bonding tool 202 is raised to break the connection between bonded ball 200b (which may now be termed conductive bump 200c) and the remainder of wire 200. For example, bonding tool 202 may be raised to an EFO height which is a position at which an electronic flame-off device forms a free air ball on wire tail 200d of wire 200. In connection with raising bonding tool 202 to break the connection at Step 7, ultrasonic energy or the like may also be applied to facilitate threading of slack length of wire 200e through the tip of bonding tool 202 to provide wire tail 200d.

In FIG. 2, the height of bonding tool 202 at Steps 5 and 6 is the same; however, it is understood that this height may be changed as desired from one step to the next to achieve the desired smoothing.

By providing the slack length of wire 200e in this process prior to tearing wire 200 to separate conductive bump 200b from the remainder of wire 200, a desirable wire tail length 200d is provided. Thus, the potential for short tails (where there is not enough wire to form the next free air ball hanging below the tip of bonding tool 202) is substantially reduced.

Thus, a desirable level of horizontal smoothing can be accomplished in Step 6 of FIG. 2 without substantial risk of complications related to premature separation.

The smoothing at Step 6 of FIG. 2 may vary considerably. For example, the smoothing operation may consist of a single horizontal motion of bonding tool 202 across the top surface of bonded ball 200*b* as shown in FIG. 2. However, multiple motions (e.g., back and forth, in different directions, etc.) may be provided in the smoothing operation. Further, the smoothing motion may be completely horizontal as shown in Step 6, or may have both horizontal and vertical (e.g., upward or downward) components. Thus, the smoothed surface may be sloped in a given direction as is desired. Further still, the smoothing step of Step 6 may be combined with the lowering of bonding tool 202 of Step 5 into a single (e.g., simultaneous) motion. That is, the motion of bonding tool 202 may follow an angled path (e.g., downward and to the right as shown in FIG. 2) whereby the lowering of Step 5 and the smoothing of Step 6 are completed in a single motion.

Figure 1:
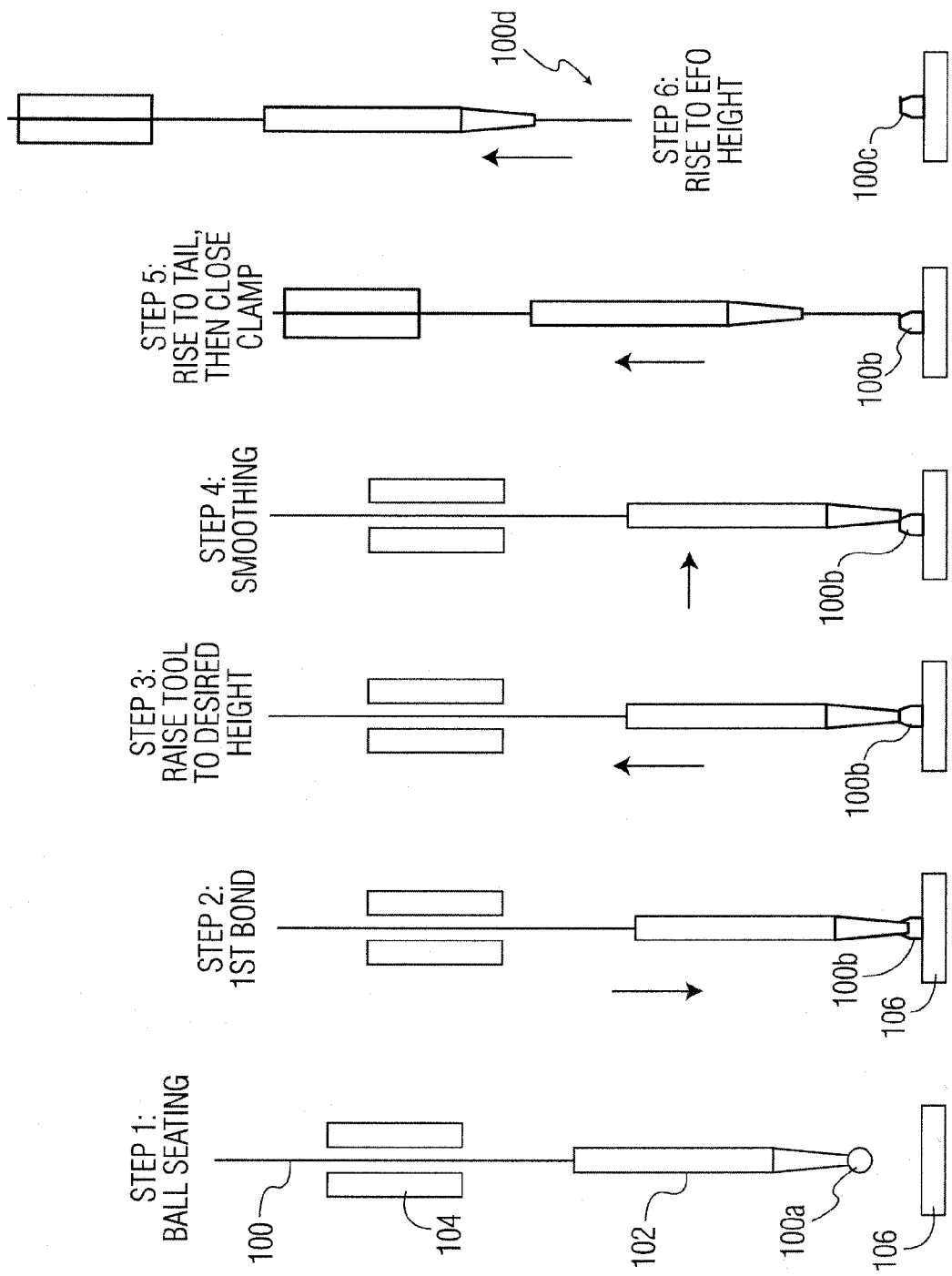
FIG. 1 is a series of diagrams illustrating a conventional approach of forming a conductive bump.
Figure 3A:
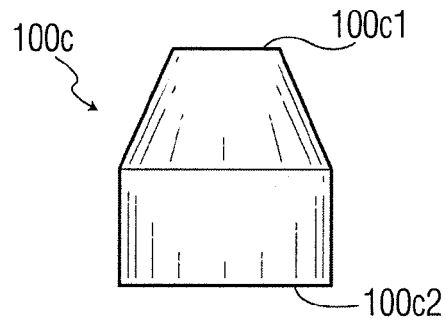
FIGS. 3A-3B are side and top block diagram views of a conductive bump formed according to the technique of FIG. 1.
Figure 3B:
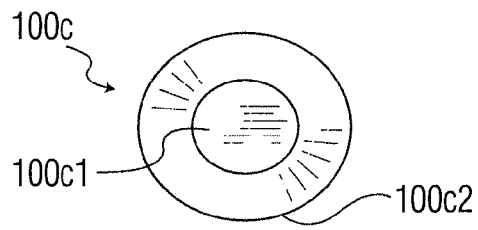

Because the desired level of horizontal smoothing of the top surface of a conductive bump can now be accomplished, a more desirable conductive bump is provided. Referring to FIGS. 3A-3B, a side and top block diagram view of conductive bump 100*c* formed according to a conventional technique is provided. These drawings are illustrative only, and not intended to illustrate the actual shape of the conductive bump. Conductive bump 100*c* includes lower surface 100*c*2 bonded to a bonding location (such as bonding location 106 in FIG. 1), and an upper surface 100*c*1 that has been smoothed (e.g., using Step 4 of FIG. 1). As can be seen from looking at the top view of conductive bump 100*c*, the area of upper surface 100*c*1 is significantly smaller than that of lower surface 100*c*2. For example, the surface area of upper surface 100*c*1 may be between 50-80% of the surface area of lower surface 100*c*2.

Figure 3C:
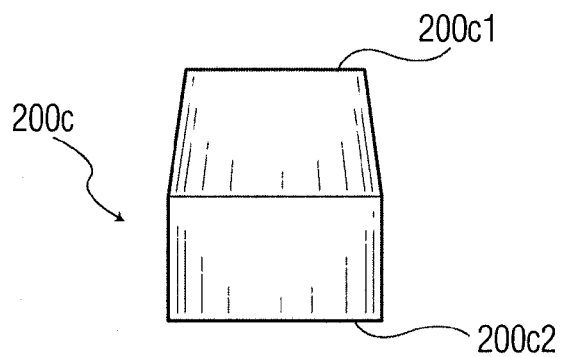
FIGS. 3C-3D are side and top block diagram views of a conductive bump formed according to the inventive technique of FIG. 2.
Figure 3D:
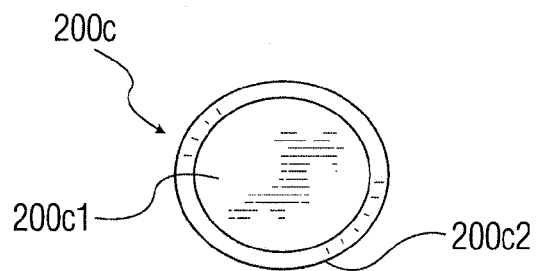

Referring to FIGS. 3C-3D, a side and top block diagram view of conductive bump 200*c* formed according to an exemplary embodiment of the present invention is provided. These drawings are illustrative only, and not intended to illustrate the actual shape of the conductive bump. Conductive bump 200*c* includes lower surface 200*c*2 bonded to a bonding location (such as bonding location 206 in FIG. 2), and an upper surface 200*c*1 that has been smoothed (e.g., using Step 6 of FIG. 2). As can be seen from looking at the top view of conductive bump 200*c*, upper surface 200*c*1 occupies almost the same area as lower surface 100*c*2. For example, upper surface 200*c*1 may be between 80-98% of the surface area of lower surface 100*c*2, and perhaps even 90-98% of the surface area of lower surface 100*c*2. This increase in the relative surface area of the upper surface of a conductive bump in comparison to the lower surface of the bump is at least partially attributed to the increased horizontal smoothing that is enabled according to the present invention.

The present invention may be used to form conductive bumps in a number of applications. For example, the bumps may be used in connection with flip chip interconnections. Another exemplary application is conductive bumping associated with wafer testing of devices. Yet another exemplary use of the conductive bumps is as stand offs. For example, the inventive conductive bumps may be used as a stand off in connection with stacked die wire bonding. Further, the inventive conductive bumps may be used as a stand off in connection with stand-off stitch bonding (i.e., SSB bonding) such as illustrated in FIGS. 4A-4B.

Figure 4A:
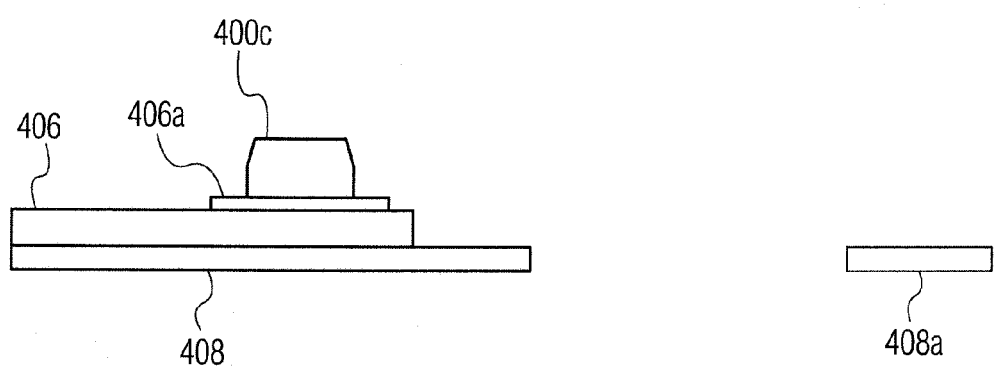
FIGS. 4A-4B are diagrams illustrating a method of forming a wire loop in accordance with an exemplary embodiment of the present invention.
Figure 4B:
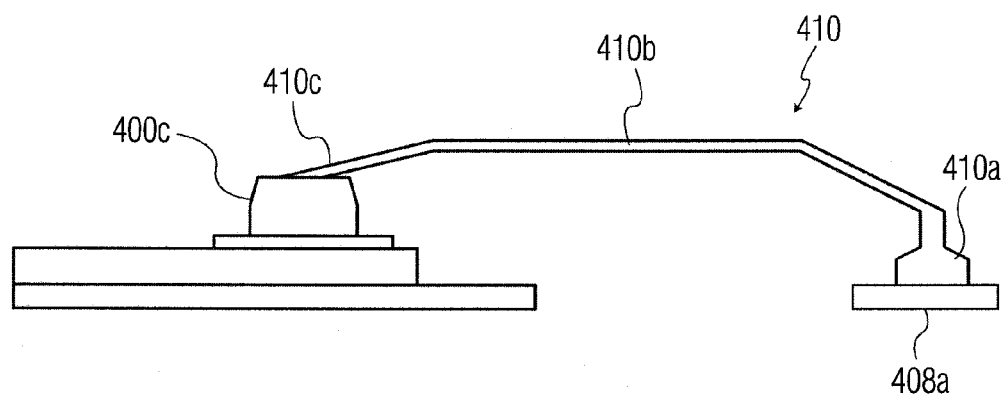

FIG. 4A illustrates conductive bump 400*c* which has been formed on bonding location 406*a* (e.g., die pad 406*a* of semiconductor die 406). Semiconductor die 406 is supported by substrate 408 (e.g., leadframe 408). For example, conductive bump 400*c* has been formed according to the method described in FIG. 2 or another method according to the present invention. It is desired to now electrically connect bonding location 408*a* (e.g., lead finger 408*a* of leadframe 408) to conductive bump 400*c*. FIG. 4B illustrates continuous wire loop 410 providing electrical interconnection between lead finger 408*a* and conductive bump 400*c*. As is known to those skilled in the art, bonded portion 410*a* (e.g., first bond 410*a*) is formed on lead finger 408*a*. Then, length of wire 410*b* (continuous with first bond 410*a*) is extended toward conductive bump 400*c*. Then, wire portion 410*c* is bonded (e.g., second bond 410*c* is formed as a stich bond) on conductive bump 400*b*. Thus, conductive bump 400*b* acts as a stand-off for wire loop 410.

The bonding of wire portion 410*c* (e.g., second bond 410*c*) to conductive bump 400*c* may be a closed loop controlled process. For example, a z-position of the bonding tool may be monitored, wherein the ultrasonic energy applied during the bonding of wire portion 410*c* to conductive bump 400*c* is turned off upon the bonding tool reaching a predetermined z-position. More specifically, prior to the formation of second bond 410*c* on conductive bump 400*c*, the bonding tool descends toward conductive bump 400*c*. After impact between the bonding tool (including wire portion 410*c* carried by the bonding tool) and conductive bump 400*c* at a certain z-position, a reference position may be established (where the reference position may be, for example, the impact z-position, a z-position slightly above the impact position, the smoothing z-position, a z-position where ultrasonic energy is applied during second bond formation, a z-position at a predetermined time after impact between the bonding tool and the bump, amongst others). Then, the ultrasonic energy is applied to form second bond 410*c*, that is, to bond wire portion 410*c* to conductive bump 400*c* (where the ultrasonic energy may be turned on before impact, upon impact, upon the bonding tool reaching the reference position, etc.).

Then, the ultrasonic energy is turned off (or reduced, for example, by at least 50% of the energy level) (e.g., with or without a predetermined time delay) upon the bonding tool reaching the predetermined z-position such that the bonding tool does not drive too deep into conductive bump 400*c*. For example, the predetermined z-position may be selected relative to a reference z-position. That is, after the bonding tool reaches the selected reference position, the z-position is monitored (e.g., using a z-axis encoder or other technique) to determine when the bonding tool reaches the predetermined position. Of course, other techniques of determining the predetermined z-position (and/or the reference z-position) are contemplated within the scope of the present invention.

The inventive techniques disclosed herein are particularly applicable to copper wire bonding. Copper wire has certain physical properties that tend to exacerbate the potential for short tail errors using conventional bumping techniques. Thus, the present invention provides exceptional benefits to copper wire bumping and bonding processes. Of course, the inventive techniques are also applicable to other types of wire bonding including, for example, gold, aluminum, and Pd coated Cu wire bonding.

Although the present invention has been described primarily with respect to certain exemplary method steps in a predetermined order, it is not limited thereto. Certain of the steps may be rearranged or omitted, or additional steps may be added, within the scope of the present invention.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method of forming a conductive bump, the method comprising the steps of:
   (1) bonding a free air ball to a bonding location using a bonding tool to form a bonded ball;
   (2) raising the bonding tool to a desired height, with a wire clamp open, while paying out wire continuous with the bonded ball;
   (3) closing the wire clamp;
   (4) lowering the bonding tool to a smoothing height with the wire clamp still closed;
   (5) smoothing an upper surface of the bonded ball, with the wire clamp still closed, using the bonding tool; and
   (6) raising the bonding tool, with the wire clamp still closed, to separate the bonded ball from wire engaged with the bonding tool.

2. The method of claim 1 wherein step (1) includes bonding the free air ball to the bonding location using at least one of ultrasonic energy, thermosonic energy, and thermocompressive energy.

3. The method of claim 1 wherein step (1) includes bonding the free air ball to the bonding location using (1) at least one of ultrasonic energy, thermosonic energy, and thermocompressive energy, and (2) a scrubbing motion of an XY table of a wire bonding machine.

4. The method of claim 1 wherein step (2) includes raising the bonding tool to the desired height, the desired height being a tail height of a bumping process.

5. The method of claim 1 wherein step (2) includes raising the bonding tool to the desired height, the desired height being between 5-20 mils above an upper surface of the bonded ball.

6. The method of claim 1 wherein step (4) includes lowering the bonding tool to the smoothing height such that a tip portion of the bonding tool is in contact with an upper surface of the bonded ball.

7. The method of claim 1 wherein step (4) includes lowering the bonding tool to the smoothing height, the smoothing height being 0.1-2 mils higher than a height of the bonding tool during step (1).

8. The method of claim 1 wherein step (4) includes forming a slack length of wire between the wire clamp and the bonding tool by lowering the bonding tool to the smoothing height with the wire clamp still closed.

9. The method of claim 8 wherein step (6) includes applying ultrasonic energy during the raising of the bonding tool to pass at least a portion of the slack length of wire through the bonding tool to form a wire tail.

10. The method of claim 1 wherein step (6) includes applying ultrasonic energy during the raising the bonding tool.

11. The method of claim 1 wherein steps (4) and (5) occur at least partially simultaneously.

12. The method of claim 1 wherein steps (4) and (5) occur through a downward, and angled, motion of the bonding tool.

13. The method of claim 1 wherein during step (5) the upper surface of the bonded ball is smoothed by a horizontal motion of the bonding tool.

14. The method of claim 1 wherein during step (5) the upper surface of the bonded ball is smoothed by a motion of the bonding tool having a downward and a horizontal component.

15. The method of claim 1 wherein during step (5) the upper surface of the bonded ball is smoothed by a motion of the bonding tool having an upward and a horizontal component.

16. The method of claim 1 wherein ultrasonic energy is applied to the bonding tool during at least a portion of step (5).

17. A method of forming a wire loop comprising the steps of:
   (1) forming a conductive bump on a bonding location, the step of forming the conductive bump including:
      (a) bonding a free air ball to a bonding location using a bonding tool to form a bonded ball;
      (b) raising the bonding tool to a desired height, with a wire clamp open, while paying out wire continuous with the bonded ball;
      (c) closing the wire clamp;
      (d) lowering the bonding tool to a smoothing height with the wire clamp still closed;
      (e) smoothing an upper surface of the bonded ball, with the wire clamp still closed, using the bonding tool; and
      (f) raising the bonding tool, with the wire clamp still closed, to separate the bonded ball from wire engaged with the bonding tool, thereby forming a conductive bump on the bonding location;
   (2) bonding a portion of wire to another bonding location using the bonding tool;
   (3) extending a length of wire from the bonded portion of wire to the conductive bump; and
   (4) bonding an end of the length of wire to the conductive bump.

18. The method of claim 17 wherein step (3) includes extending the length of wire from the bonded portion such that the length of wire is continuous with the bonded portion.

19. The method of claim 17 wherein step (a) includes bonding the free air ball to the bonding location using at least one of ultrasonic energy, thermosonic energy, and thermocompressive energy.

20. The method of claim 17 wherein step (a) includes bonding the free air ball to the bonding location using (1) at least one of ultrasonic energy, thermosonic energy, and thermocompressive energy, and (2) a scrubbing motion of an XY table of a wire bonding machine.

21. The method of claim 17 wherein step (b) includes raising the bonding tool to the desired height, the desired height being a tail height of a bumping process.

22. The method of claim 17 wherein step (b) includes raising the bonding tool to the desired height, the desired height being between 5-20 mils above an upper surface of the bonded ball.

23. The method of claim 17 wherein step (d) includes lowering the bonding tool to the smoothing height such that a tip portion of the bonding tool is in contact with an upper surface of the bonded ball.

24. The method of claim 17 wherein step (d) includes lowering the bonding tool to the smoothing height, the smoothing height being 0.1-2 mils higher than a height of the bonding tool during step (a).

25. The method of claim 17 wherein step (d) includes forming a slack length of wire between the wire clamp and the bonding tool by lowering the bonding tool to the smoothing height with the wire clamp still closed.

26. The method of claim 25 wherein step (f) includes applying ultrasonic energy during the raising the bonding tool to pass at least a portion of the slack length of wire through the bonding tool to form a wire tail.

27. The method of claim 17 wherein step (f) includes applying ultrasonic energy during the raising of the bonding tool.

28. The method of claim 17 wherein steps (d) and (e) occur at least partially simultaneously.

29. The method of claim 17 wherein steps (d) and (e) occur through a downward, and angled, motion of the bonding tool.

30. The method of claim 17 wherein during step (e) the upper surface of the bonded ball is smoothed by a horizontal motion of the bonding tool.

31. The method of claim 17 wherein during step (e) the upper surface of the bonded ball is smoothed by a motion of the bonding tool having a downward and a horizontal component.

32. The method of claim 17 wherein during step (e) the upper surface of the bonded ball is smoothed by a motion of the bonding tool having an upward and a horizontal component.

33. The method of claim 17 wherein ultrasonic energy is applied to the bonding tool during at least a portion of step (e).

34. The method of claim 17 wherein during step (4) a z-position of the bonding tool is monitored, and wherein an ultrasonic energy applied during the bonding of step (4) is turned off upon the bonding tool reaching a predetermined z-position.

35. The method of claim 34 wherein the predetermined z-position is selected relative to a reference z-position, the reference z-position being a smoothing height of the bonding tool during step (e).

36. The method of claim 34 wherein the predetermined z-position is selected relative to a reference z-position, the reference z-position being an initial z-position at which ultrasonic energy is turned on during step (4).

37. The method of claim 34 wherein the predetermined z-position is selected relative to a reference z-position, the reference z-position being a position of the bonding tool a predetermined time after impact deformation between (1) the bonding tool and the end of the length of wire, and (2) the conductive bump.

38. The method of claim 17 wherein during step (4) a z-position of the bonding tool is monitored, and wherein an ultrasonic energy applied during the bonding of step (4) is turned off upon the bonding tool reaching a predetermined z-position after a predetermined time delay.

39. The method of claim 38 wherein the predetermined z-position is selected relative to a reference z-position, the reference z-position being a smoothing height of the bonding tool during step (e).

40. The method of claim 38 wherein the predetermined z-position is selected relative to a reference z-position, the reference z-position being an initial z-position at which ultrasonic energy is turned on during step (4).

41. The method of claim 38 wherein the predetermined z-position is selected relative to a reference z-position, the reference z-position being a position of the bonding tool a predetermined time after impact deformation between (1) the bonding tool and the end of the length of wire, and (2) the conductive bump.

42. The method of claim 17 wherein during step (4) a z-position of the bonding tool is monitored, and wherein an ultrasonic energy level applied during the bonding of step (4) is reduced upon the bonding tool reaching a predetermined z-position.

43. The method of claim 42 wherein the ultrasonic energy level is reduced by at least 50% upon the bonding tool reaching a predetermined z-position.

44. The method of claim 42 wherein the predetermined z-position is selected relative to a reference z-position, the reference z-position being a smoothing height of the bonding tool during step (e).

45. The method of claim 42 wherein the predetermined z-position is selected relative to a reference z-position, the reference z-position being an initial z-position at which ultrasonic energy is turned on during step (4).

46. The method of claim 42 wherein the predetermined z-position is selected relative to a reference z-position, the reference z-position being a position of the bonding tool a predetermined time after impact deformation between (1) the bonding tool and the end of the length of wire, and (2) the conductive bump.

47. The method of claim 17 wherein during step (4) a z-position of the bonding tool is monitored, and wherein an ultrasonic energy level applied during the bonding of step (4) is reduced upon the bonding tool reaching a predetermined z-position after a predetermined time delay.

48. The method of claim 47 wherein the ultrasonic energy level is reduced by at least 50% upon the bonding tool reaching a predetermined z-position.

49. The method of claim 47 wherein the predetermined z-position is selected relative to a reference z-position, the reference z-position being a smoothing height of the bonding tool during step (e).

50. The method of claim 47 wherein the predetermined z-position is selected relative to a reference z-position, the reference z-position being an initial z-position at which ultrasonic energy is turned on during step (4).

51. The method of claim 47 wherein the predetermined z-position is selected relative to a reference z-position, the reference z-position being a position of the bonding tool a predetermined time after impact deformation between (1) the bonding tool and the end of the length of wire, and (2) the conductive bump.

* * * * *